MINIATURE RADIO BEACON APPARATUS
Filed Oct. 23, 1961
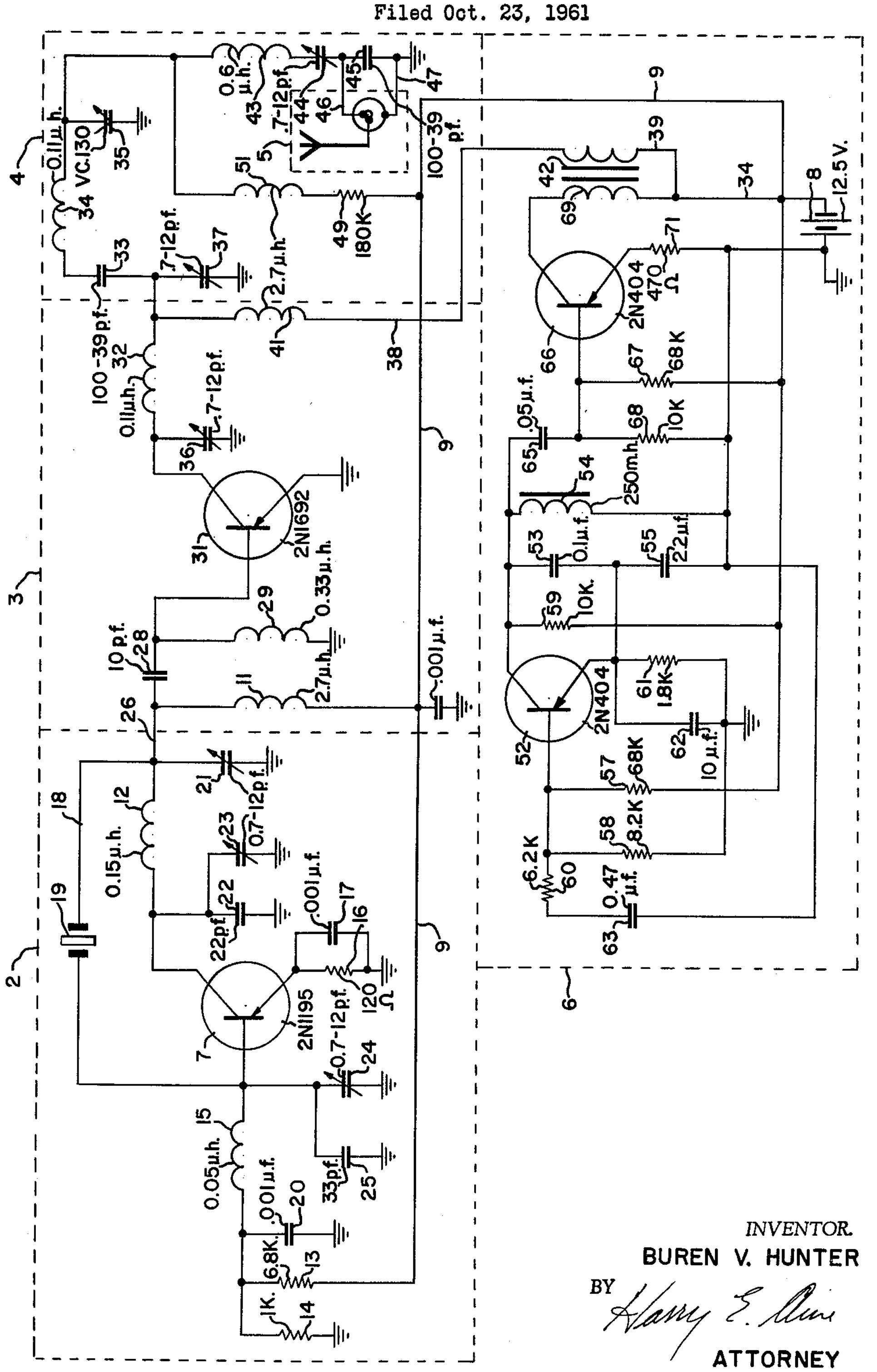
INVENTOR.
BUREN V. HUNTER
BY Harry E. [signature]
ATTORNEY

United States Patent Office 3,108,223
Patented Oct. 22, 1963

3,108,223

MINIATURE RADIO BEACON APPARATUS

Buren V. Hunter, Santa Clara County, Calif., assignor to Harry E. Aine, Palo Alto, and Arthur Leinwohl, San Jose, Calif.

Filed Oct. 23, 1961, Ser. No. 146,722
11 Claims. (Cl. 325—105)

The present invention relates in general to miniature radio beacon apparatus and, more specifically, to a novel efficient VHF-UHF radio beacon useful for finding lost objects or persons by transmitting an audio amplitude modulated radio frequency homing signal receivable by standard UHF direction finding equipment carried in most present day military and commercial aircraft at line-of-sight ranges up to or in excess of 100 miles.

The miniature radio beacons with which the present invention is most appropriately practiced are of the size wherein the volume of the entire electronic circuitry is in the order of approximately 10 cubic inches or less and transmits a crystal controlled audio amplitude modulated signal ranging in power output from 100 milliwatts up to two watts in the VHF-UHF range, that is, between the frequencies of 100 and 400 megacycles.

Miniaturization of such high frequency electronic circuits necessitates close packing of the circuit elements. Such close packing introduces many possible feedback paths for initiation of certain undesired modes of oscillation. Therefore, it has been found difficult in the past to crystal control these circuits while delivering sufficient power output at the crystal frequency in the desired VHF range.

When the output frequency of the transmitter is in the UHF range, at least one stage of frequency multiplication is usually required since crystals are not available in the UHF range above 200 megacycles. It has previously been proposed to multiply the crystal frequency to the UHF band in an intermediate stage and then use a UHF transistor amplifier in the final or output stage. However, it has been found that transistors operating above the 200 megacycle range have very low gain, i.e., in the order of 4 to 6 db, are relatively inefficient and, furthermore, are power limited to generally something below 200 milliwatts.

In the present invention there is provided a novel crystal controlled oscillator circuit which assures reliable starting and exact crystal control over a wide range of varying stray crystal capacities and close packing of elements at relatively high power levels, and which novel circuit is easily duplicated in production.

Also, the present invention provides frequency multiplication in the final output stage by use of a voltage variable capacitive (varactor) diode which is capable of dissipating more power than available transistors while yielding efficient doubling and permitting the higher power to be generated more efficiently at lower frequencies before translation to the higher output frequency. The voltage variable capacitor, hereinafter referred to as a varactor diode, surprisingly, has been found useful for translating the audio modulation to the output frequency without producing excessive distortion of the audio modulation.

The principal object of the present invention is the provision of an efficient, more powerful, reliable, small VHF–UHF radio beacon useful for locating lost objects and persons.

One feature of the present invention is the provision of a high impedance parallel resonant circuit connected between base and emitter terminals of a common emitter crystal controlled oscillator for assuring starting of the oscillator at the crystal frequency and for assuring that the crystal controlled oscillator will always oscillate at the crystal frequency over a wide range of varying crystal capacities thereby minimizing oscillator fabrication time and expense.

Another feature of the present invention is the provision of a varactor multiplier in the final stage of an audio amplitude modulated VHF-UHF beacon for efficiently obtaining R.F. power output in the order of 150 milliwatts or more at frequencies above 200 megacycles without introducing excessive distortion of the audio amplitude modulation.

Another feature of the present invention is the provision of a novel varactor diode multiplier circuit which matches the output impedance of the preceding driver, at the fundamental frequency, to the impedance of the varactor diode while minimizing losses within the driver stage and minimizing losses within the varactor multiplier circuit whereby efficient frequency multiplication is obtained at relatively high power levels.

Other features and advantages of the present invention will become apparent upon a perusal of the specification taken in connection with the accompanying drawing, wherein FIG. 1 is the circuit diagram for the novel VHF-UHF beacon transmitter of the present invention.

Referring now to FIG. 1, the transmitter, in block diagram form, includes a crystal controlled transistorized oscillator 2, indicated in phantom lines. The output of the oscillator at the crystal frequency is fed to the input of a transistor amplifier 3 for amplification therein. The output of the amplifier 3 is then fed in the input of a varactor diode multiplier 4 wherein the frequency is doubled to the output frequency. The output of the varactor doubler 4 is fed to an antenna 5 for radiation therefrom. The transmitter is audio amplitude modulated by an audio modulator 6, the output thereof being transformer coupled to amplitude modulate the collector electrode of the transistor amplifier 3. The audio amplitude modulator 6 is set for a frequency easily within the audio band such as, for example, 1000 cycles per second to provide a distinctive audio note. The audio modulation is transferred to the output frequency within the varactor diode multiplier stage 4. The various elements of the beacon transmitter will now be more fully described.

In the crystal controlled oscillator 2 a suitable transistor 7 such as, for example, a 2N1195 is connected as a common emitter for VHF signals and as a common collector for D.C. The D.C. potentials are applied to the transistor 7 from a suitable battery 8 such as, for example, a 12.5 volt low temperature mercury oxide battery. The battery 8 is connected as a positive ground. The negative potential is applied to the collector electrode of transistor 7 via lead 9, R.F. choke 11, and tank inductor 12.

The proper base bias for transistor 7 is established by means of a voltage divider network having resistors 13 and 14 series connected between the negative lead 9 and the positive ground. The D.C. bias current for the transistor 7 is then fed from the center tapped base voltage divider to the base electrode via base to emitter tank circuit inductor 15.

A D.C. emitter load resistor 16 is connected between the emitter and ground. Resistor 16 is bypassed for R.F. by R.F. bypass capacitor 17 of a sufficiently large capacitance such that the emitter is essentially, for VHF frequencies, connected directly to ground.

Feedback current for sustaining oscillation of the transistor 7 is derived from a tap on the collector tank and fed via lead 18 and series resonant fifth overtone 121.5 mc. crystal 19 to the base electrode of the transistor 7. The stray crystal capacity, shunting the terminals of the crystal 22, has been found to vary considerably from crystal to crystal as, for example, from 5 to 10 picofarads as these crystals come from the supplier. Heretofore it has been proposed that this stray capacitance be tuned out by the provision of an inductor connected across the crystal and parallel resonated with the stray crystal capacitance to present a high impedance except at the series resonance of the crystal. However, it has been found that each of these inductors would have to be specially built due to the variance in stray capacitance of the crystals.

Compensation for the variance in the amount of the stray capacitance across the crystal is obtained in the present oscillator circuit by means of the output resonant $\pi$ network loop including tank inductor 12, parallel variable capacitor 21 parallel connected with the stray capacitance of the crystal all in series with parallel connected capacitors 22 and 23. The principal capacitive reactance determining element of this series resonant $\pi$ network loop is variable capacitor 21. Since variable capacitor 21 is in parallel, in this loop, with the crystal capacitance the variable crystal stray capacity may be readily tuned by capacitor 21.

Unwanted stray current feedback which vary originate in the base of emitter circuit and cause unstable crystal control or starting on frequencies other than the crystal frequency is prevented by means of a high impedance tuned circuit connected between base and emitter terminals. More specifically, base tank indicator 15 is parallel resonated with a relatively large capacity including parallel connected capacitors 24 and 25 at the crystal frequency. By making the net capacitors 24 and 25 large compared to the stray capacity (5–10 pf.) of the crystal the crystal stray capacity is effectively parallel connected to capacitor 21, as previously explained. Capacitor 25 connecting the remote end of base tank inductor 15 to ground serves as an R.F. bypass capacitor and is made of a sufficiently large capacitance to present substantially a short circuit at the VHF frequency of the oscillator. It has been found that when the high impedance parallel resonant base tank circuit is provided in the crystal controlled oscillator circuit 2 that in spite of the close packing of the elements in the miniature beacon and in spite of the variance of the stray capacitance of the crystals 19, the oscillator circuit is easily duplicated and readily starts on the crystal frequency and maintains the crystal control while delivering output oscillator powers up to 60 milliwatts or more at 120 megacycles.

Output power is extracted from the crystal oscillator 2 via lead 26 tapping the collector to emitter $\pi$ tank circuit across variable capacitor 21.

The input impedance of the transistor amplifier 3 is matched to the oscillator tank impedance via a resonant $\pi$ network including variable capacitor 21, parallel connected crystal stray capacitance, D.C. blocking capacitor 28 and inductor 29, all resonated at the crystal oscillator frequency.

The transistor amplifier 3 includes a suitable transistor 31 such as, for example, a 2N1692 connected as a common emitter for both A.C. and D.C. Transistor 31 is biased for class C operation by means of inductor 29 having a D.C. resistance of approximately 1 ohm to establish a proper D.C. bias condition between base and emitter electrodes by the base current.

A novel double tuned output circuit of transistor amplifier 3 serves the multifold function of presenting a high impedance output load to the transistor 31, matching the impedance of the transistor to the input impedance of the varactor multiplier diode, and, in addition, also preventing reflection of the high frequency multiplied output frequency from the varactor back to the transistor 31.

The double tuned transistor output circuit includes a first resonant circuit loop through the varactor diode multiplier composed of inductor 32, D.C. blocking capacitor 33, second inductor 34, varactor diode 35 as of, for example, a VC130, and variable capacitor 36. These elements are series resonated at the fundamental or crystal frequency. The principal capacitive reactance determining element of this resonant loop is provided by variable capacitor 36 which is tuned for resonance at the fundamental frequency.

Reflection of the multiplied frequency output power back through elements 32 and 36 is prevented by a second tuned circuit forming a series resonant trap at the output frequency. The resonant trap is formed by the series resonant loop including variable capacitor 37, D.C. blocking capacitor 33, second inductor 34 and varactor diode 35 tuned for resonance via capacitor 37 at the multiplied output frequency.

The efficiency of the frequency of the frequency multiplier is thus enhanced since the reflected output power is trapped and prevented from being lost in the resistance of the transistor 31 and remaining portion of the transistor tank circuit including inductor 32 and capacitor 36.

D.C. collector bias is fed to the collector electrode of transistor 31 from the negative terminal of the battery 8 via leads 38, transformer secondary 39, R.F. choke 41 and collector tank inductor 32. At the VHF frequency of 121.5 megacycles, transistor amplifier 3 has an efficiency of approximately 60% with approximately 10 db of power gain.

In a first embodiment the transistor amplifier 3 is audio modulated via collector electrode modulation impressed upon the collector bias via transformer 42 connected as the load for the audio modulator 6. The amplitude of the modulation is preferably between 50 and 20% to minimize the amount of the transmitted power present in audio sidebands since most UHF direction finding equipment, such as the ARC–27–ARA25, utilizes the lobe switching method which is responsive only to the carrier power. By maintaining the audio modulation index between 20 and 50%, a sufficient amount of energy is transferred to the tone while leaving a substantial percentage of the transmitted power in the carrier which is utilized for homing purposes. The details of the audio modulator 6 will be more fully described below.

In one embodiment of the present invention the varactor diode 35 is connected for doubling the frequency of the fundamental frequency energy supplied from the transistor amplifier 3 and supplies this multiplied energy in its output circuit to a suitable load as, for example, the antenna assembly 5.

The output circuit of the varactor diode 35 includes series connected inductor 43 and variable capacitor 44 series resonated at the output frequency of the varactor multiplier circuit 4 which, in a preferred embodiment, is just double the input frequency of 121.5 or 243.0 megacycles.

Series connected fixed capacitor 45 forms an R.F. voltage divider network in the series resonance loop for matching into the relatively low impedance of the antenna assembly 5. Output leads 46 and 47, respectively, are connected across the capacitor 45 and are connected respectively to the antenna and the ground via, for example, a suitable length of coaxial cable, not shown. When a quarter-wave stub antenna is utilized over a ground plane, the input impedance of the antenna is approximately 30 ohms and, accordingly, the reactive impedance across the fixed capacitor 45 is approximately matched to this relatively low 30 ohm impedance.

A small negative D.C. back bias voltage is applied across the varactor diode 35 via lead 9, voltage dropping resistor 49 and radio frequency choke 51. The back negative bias applied to the varactor diode 35 is adjusted by selecting a correct value of resistor 49 to obtain maximum efficiency in the varactor multiplier circuit.

Audio amplitude modulation present on the fundamental carrier frequency is applied via the input circuit of the varactor diode to the varactor diode 35 and is transferred therein to an amplitude modulation of the output frequency, in spite of the non-linear characteristics of the varactor diode. It has also been found that the audio amplitude modulation is not substantially distorted such that a clear audio tone amplitude modulation is transferred via the varactor diode from the fundamental frequency to the output frequency.

The use of the varactor diode as the output stage of an audio amplitude modulated beacon permits higher power to be generated in the output at substantially enhanced efficiencies due to the previous inadequacies of transistor amplifiers and/or transistor doublers to efficiently supply substantial amounts of R.F. power as, for example, 200 milliwatts at 240 megacycles and above. At an input carrier power level of 180 milliwatts at 121.5 megacycles, the varactor multiplier doubles this frequency to 243 megacycles with a 65% efficiency.

In another embodiment of the present invention the audio amplitude modulation is impressed directly across varactor diode 35 via the back bias network connected to the secondary of transformer 42.

The relatively high efficiency of the varactor doubler circuit 4 is believed due, in large part, to the high Q input varactor diode circuit which serves to efficiently match the output of the amplifier to the varactor diode 35 via the intermediary of the network having variable capacitor 37 forming a shunt trap with the second inductor 34. The double tuned varactor input circuit serves to efficiently couple the fundamental frequency into the diode 35 while preventing the multiplied output signal from being reflected back through the first resonant network.

The audio modulator 6 includes a colpitts transistor oscillator having its output applied to an amplifier, the output circuit of which includes transformer 42, the secondary 39 of which serves to modulate the transistor amplifier 3. More specifically, transistor 52 is connected as a colpitts audio oscillator, the resonant frequency being approximately 1000 cycles per second and determined by parallel-connected capacitor 53 and inductor 54 connected between collector and base electrode of transistor 52. Capacitor 55 is connected in series with capacitor 53 of the tank to form an audio frequency voltage divider. The voltage divided by capacitors 53 and 55 is fed via leads 56 to the emitter circuit of the transistor 52 to sustain audio oscillation thereof at the tank frequency.

D.C. base bias for transistor 52 is derived from the battery 8 via a voltage divider network formed by series connected resistors 57 and 58 connected across the battery terminals. The negative collector bias is derived from the negative terminal of the battery 8 via bias resistor 59. Emitter bias is obtained via resistor 61 connected between the emitter electrode and the grounded positive terminal of the battery. An audio bypass capacitor 62 is parallel-connected with emitter bias resistor 61. A base to collector tank capacitor 63 is connected between the base and collector tank for wave shaping. Resistor 60 forms a time constant with capacitor 63 for the aforementioned wave shaping. A coupling capacitor 65 is connected to the collector end of the tank circuit and serves to couple audio current from the audio oscillator 52 to the amplifying transistor 66 via the base electrode thereof. Base bias is obtained for transistor amplifier 66 via series connected voltage divider resistors 67 and 68 connected across the terminals of the battery 8. The primary 69 of transformer 42 is connected between collector and emitter electrodes of transistor 66 and serves as the audio load thereof. Resistor 71 connected between the emitter electrode of transistor 66 and ground provides the proper emitter bias for transistor 66.

Since many changes could be made in the above construction and many apparently widely different embodiments of this invention could be made without departing from the scope thereof, it is intended that all matter contained in the above description or shown in the accompanying drawing shall be interpreted as illustrative and not in a limiting sense.

What is claimed is:

1. A miniature high frequency amplitude modulated radio beacon including, means for generating a first high frequency carrier, a varactor diode frequency multiplier connected in circuit as the final active stage in the radio beacon for multiplying the first carrier frequency to the output carrier frequency for radiation from the radio beacon, means for audio amplitude modulating the output carrier frequency, said modulator means including said varactor diode multiplier for transferring amplitude audio modulation to said output carrier frequency.

2. The apparatus according to claim 1 wherein said modulator means applies the audio amplitude modulation to the first carrier frequency before the first carrier frequency is applied to said varactor diode multiplier, whereby said amplitude modulation is transferred to said output carrier frequency via the intermediary of said varactor diode multiplier.

3. The apparatus according to claim 1 wherein said amplitude modulator means is connected to apply its amplitude modulating signal across said varactor diode multiplier for transferring said amplitude modulation to the output carrier frequency.

4. A miniature high frequency amplitude modulated radio beacon including, a high frequency oscillator, means for deriving from said high frequency oscillator a first carrier signal, a varactor diode multiplier connected as a final stage of the radio beacon for receiving the first carrier signal and doubling the first carrier signal to a final double frequency carrier signal for radiation from the beacon, and an audio frequency amplitude modulator connected for amplitude modulating the first carrier signal before application thereof to said varactor diode multiplier.

5. The apparatus according to claim 4 including, a transistor amplifier having base, emitter, and collector electrodes connected in circuit intermediate said oscillator and said varactor doubler for amplifying the first carrier signal before doubling thereof, said amplitude modulator being connected in circuit with said collector electrode of said transistor amplifier to amplitude modulate the collector electrode of said transistor amplifier, a resonant input circuit resonant at the frequency of said first carrier signal and being coupled in circuit with the collector electrode of said amplitude modulated amplifier and said varactor diode for transmitting the amplified first carrier signal to said varactor diode, and a tuned output circuit resonant at double the frequency of the first carrier signal connected to said varactor diode doubler.

6. The apparatus according to claim 5 wherein said varactor diode input and output circuits are connected for series resonance at their respective input and output frequencies through said varactor diode being connected as a common element of said input and output circuits.

7. The apparatus according to claim 6 wherein said transistor amplifier includes a resonant collector to emitter network coupled to said varactor doubler and forming said input circuit and being double resonant at the fundamental input and output frequencies.

8. The apparatus according to claim 7 wherein said resonant collector to emitter network includes, a series connected capacitor and inductor tuned for resonance at double the frequency of the first carrier frequency and connected shunting across said input circuit portion tuned for resonance at the first carrier frequency for shunting the output frequency out of the remaining portion of the double resonant network.

9. A miniature UHF amplitude modulated radio beacon apparatus including, a crystal controlled oscillator for generating a first carrier signal at a first frequency, an amplifier for amplifying power of the first carrier signal, a varactor diode connected in circuit with said amplifier for doubling the frequency of said first carrier signal, a double resonant network connected in circuit intermediate said amplifier and varactor diode and forming the output circuit of said amplifier, said double resonant network having three reactive members including a first capacitor member and first and second inductive members connected between the collector electrode and emitter electrode of said amplifier, and a second capacitor series connected with said second inductive member and parallel-connected with said first capacitive member, said resonant network being tuned for a first resonance at the first carrier frequency, and for a resonance at the multiplied output frequency, and said second capacitive and inductive members being connected in series with said varactor diode and forming a portion of the input circuit thereof, and a third capacitive member and third inductive member series resonant at twice the first carrier frequency and being connected in series with said varactor diode and forming the output doubled frequency circuit of said varactor diode doubler, whereby efficient doubling of said first carrier power is obtained.

10. The apparatus according to claim 9 including, means for amplitude modulating the collector electrode of said transistor amplifier.

11. The apparatus according to claim 9 including means for amplitude modulating said varactor diode.

References Cited in the file of this patent

UNITED STATES PATENTS

| | | |
|---|---|---|
| 2,288,294 | Morelock | June 30, 1942 |
| 2,552,969 | Holman | May 15, 1951 |
| 2,980,865 | Hilbourne | Apr. 18, 1961 |
| 3,025,476 | Chow | Mar. 13, 1962 |